(12) United States Patent
Roberts et al.

(10) Patent No.: US 8,198,529 B2
(45) Date of Patent: Jun. 12, 2012

(54) TRANSPARENT CONDUCTIVE MATERIALS INCLUDING CADMIUM STANNATE

(75) Inventors: Dale Roberts, Temperance, MI (US); John German, Prairie du Sac, WI (US); Keith J. Burrows, Mineral Point, WI (US); Benyamin Buller, Sylvania, OH (US); Boil Pashmakov, Troy, MI (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 12/434,059

(22) Filed: May 1, 2009

(65) Prior Publication Data

US 2009/0272437 A1    Nov. 5, 2009

Related U.S. Application Data

(60) Provisional application No. 61/049,602, filed on May 1, 2008, provisional application No. 61/083,317, filed on Jul. 24, 2008, provisional application No. 61/155,307, filed on Feb. 25, 2009.

(51) Int. Cl.
*H01L 31/0224* (2006.01)

(52) U.S. Cl. ............................. 136/256; 136/260; 438/98

(58) Field of Classification Search .................. 136/252, 136/256, 260–265; 438/57; 204/298.13
See application file for complete search history.

(56) References Cited

U.S. PATENT DOCUMENTS

| | | | |
|---|---|---|---|
| 3,616,402 A | 10/1971 | Kumagai | |
| 4,960,466 A | 10/1990 | Koplick | |
| 5,922,142 A | 7/1999 | Wu et al. | |
| 6,278,055 B1 * | 8/2001 | Forrest et al. | 136/263 |
| 2006/0141266 A1 * | 6/2006 | Huang et al. | 428/426 |
| 2008/0066802 A1 * | 3/2008 | Reddy | 136/258 |

FOREIGN PATENT DOCUMENTS

GB       2013724       8/1979

OTHER PUBLICATIONS

Nam et al., "Synthesis and sintering properties of nanosized in sub 2 O sub 3-10 wt%SnO sub 2 powders," *Scripta Materialia* (USA); vol. 44; No. 8-9; pp. 2047-2050. May 18, 2001.

\* cited by examiner

*Primary Examiner* — Jennifer Michener
*Assistant Examiner* — Jayne Mershon
(74) *Attorney, Agent, or Firm* — Dickstein Shapiro LLP

(57) ABSTRACT

A photovoltaic cell can include a transparent conductive layer including cadmium stannate.

3 Claims, 4 Drawing Sheets

US 8,198,529 B2

TRANSPARENT CONDUCTIVE MATERIALS INCLUDING CADMIUM STANNATE

CLAIM FOR PRIORITY

This application claims priority under 35 U.S.C. §119(e) to Provisional U.S. Patent Application No. 61/049,602, filed on May 1, 2008, which is hereby incorporated by reference in its entirety; Provisional U.S. Patent Application No. 61/083,317, filed on Jul. 24, 2008, which is hereby incorporated by reference in its entirety; and Provisional U.S. Patent Application No. 61/155,307, filed on Feb. 25, 2009, which is hereby incorporated by reference in its entirety.

TECHNICAL FIELD

This invention relates to transparent conductive materials.

BACKGROUND

During the fabrication of photovoltaic devices, layers of semiconductor material can be applied to a substrate with one layer serving as a window layer and a second layer serving as the absorber layer. The window layer can allow the penetration of solar radiation to the absorber layer, where the optical power is converted into electrical power. Some photovoltaic devices can use transparent thin films that are also conductors of electrical charge. The conductive thin films can include transparent conductive layers that contain a transparent conductive oxide (TCO), such as fluorine-doped tin oxide, aluminum-doped zinc oxide, or indium tin oxide. The TCO can allow light to pass through a semiconductor window layer to the active light absorbing material and also serve as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, chrome, molybdenum or any practical combination thereof.

SUMMARY

In general, a conductive material can include a transparent conductive oxide including cadmium, tin and oxygen, wherein cadmium has a concentration of greater than 67 percent by weight. The percent cadmium is calculated as a percent weight of total metal content. For example, weight Cd/(weight Cd+weight Sn)×100=67 percent by weight.

In certain circumstances, a photovoltaic device can include a transparent conductive layer on a substrate, the transparent conductive layer including cadmium stannate, wherein cadmium has a concentration of greater than 67 percent by weight, greater than 70 percent by weight, greater than 72 percent by weight, less than 78 percent by weight, less than 76 percent by weight, less than 74 percent by weight, between 72 and 67 percent by weight, or between 70 and 72 percent by weight.

In other circumstances, a photovoltaic device can include a transparent conductive layer on a substrate, the transparent conductive layer including cadmium stannate, wherein cadmium has a concentration of greater than 67 percent by weight, greater than 70 percent by weight, greater than 72 percent by weight, less than 80 percent by weight, less than 78 percent by weight, less than 76 percent by weight, between 75 and 67 percent by weight, or between 70 and 75 percent by weight.

A photovoltaic can have a figure of merit, 1/(the square root of (average absorption* sheet resistance)), of greater than 0.9, wherein the average absorption is the absorption averaged over a wavelength interval of 350-850 nanometers. The device can further include a semiconductor layer over the transparent conductive layer. Average absorption is measured in percent units, i.e. 0 means 0 percent absorbance, 0.5 means 50 percent absorbance, and 1 means 100 percent absorbance. Sheet resistance is measured in ohm square units. Thus, the figure of merit is provided in units of 1/ohm squared.

In certain circumstances, a photovoltaic device can include a transparent conductive layer on a substrate, the transparent conductive layer including cadmium stannate, wherein the cadmium to tin ratio is greater than about 2.15:1, greater than about 2.2:1, or less than about 2.4:1.

In other circumstances, a photovoltaic device can include a transparent conductive layer on a substrate, the transparent conductive layer including cadmium stannate, wherein the cadmium to tin ratio is greater than about 2.15:1, greater than about 2.2:1, greater than about 2.4:1, less than about 2.6:1, or less than about 3:1.

In certain circumstances, a method of manufacturing a transparent conductive material including depositing cadmium stannate on a surface of a material, the cadmium stannate having a cadmium has a concentration of greater than 67 percent by weight. Depositing cadmium stannate can include sputtering a film of cadmium stannate from an alloy target containing cadmium and tin wherein the alloy target cadmium has a concentration of greater than 67 percent by weight, greater than 70 percent by weight, greater than 72 percent by weight, less than 78 percent by weight, less than 76 percent by weight, less than 74 percent by weight, between 72 and 67 percent by weight, or between 70 and 72 percent by weight.

In other circumstances, a method of manufacturing a transparent conductive material including depositing cadmium stannate on a surface of a material, the cadmium stannate having a cadmium has a concentration of greater than 67 percent by weight. Depositing cadmium stannate can include sputtering a film of cadmium stannate from an alloy target containing cadmium and tin wherein the alloy target cadmium has a concentration of greater than 67 percent by weight, greater than 70 percent by weight, greater than 72 percent by weight, less than 80 percent by weight, less than 78 percent by weight, less than 76 percent by weight, between 75 and 67 percent by weight, or between 70 and 75 percent by weight.

In other circumstances, a method of manufacturing a photovoltaic cell can include placing a first semiconductor layer on a substrate, the substrate having a surface and placing a transparent conductive layer on the surface of the substrate wherein the transparent conductive layer comprises cadmium stannate, wherein cadmium has a concentration of greater than 70 percent by weight.

The transparent conductive oxide or layer can have a figure of merit, 1/(the square root of (average absorption*sheet resistance)), of greater than 0.9, wherein the average absorption is the absorption averaged over a wavelength interval of 350-850 nanometers.

The method of claim can include depositing or placing the transparent conductive layer by sputtering, by chemical vapor deposition, by spin coating, by spray coating, by dip coating. The method can further include placing a second semiconductor layer over the first semiconductor layer.

A method of manufacturing a photovoltaic cell can include placing a first semiconductor layer on a substrate, the substrate having a surface and a transparent conductive layer on the surface of the substrate wherein the transparent conductive layer comprises cadmium stannate, wherein the cadmium to tin ratio is greater than 2.15:1, greater than 2.2:1, or greater than 2.4:1. The method can further include placing a second semiconductor layer over the first semiconductor layer.

In other circumstances, a method of manufacturing a photovoltaic cell can also include placing a first semiconductor layer on a substrate, the substrate having a surface and a transparent conductive layer on the surface of the substrate wherein the transparent conductive layer comprises cadmium stannate, wherein the cadmium to tin ratio is greater than 2.15:1, greater than 2.2:1, greater than 2.4:1, less than 2.6:1, or less than 3:1. The method can further include placing a second semiconductor layer over the first semiconductor layer. The transparent conductive layer can be deposited by sputtering. Sputtering process can include dislodging or ejecting material (e.g., atoms) from a metallic target, cadmium target, tin target, or target including both cadmium and tin. The target can be a tube or plate.

In certain circumstances, a sputtering target can include cadmium and tin in a weight ratio greater than 2.15:1, greater than 2.2:1, greater than 2.4:1, less than 2.6:1, or less than 3:1 distributed substantially uniformly throughout the target. The sputtering target can be made by manufacturing cadmium and tin into the shape of tube, casting cadmium and tin into the shape of sleeves and welding them together, powder metallurgy including pressing (e.g., isostatic pressing), wire wrap, or thermal spraying.

The details of one or more embodiments are set forth in the accompanying drawings and the description below. Other features, objects, and advantages will be apparent from the description and drawings, and from the claims.

DETAILED DESCRIPTION

Figure 1:
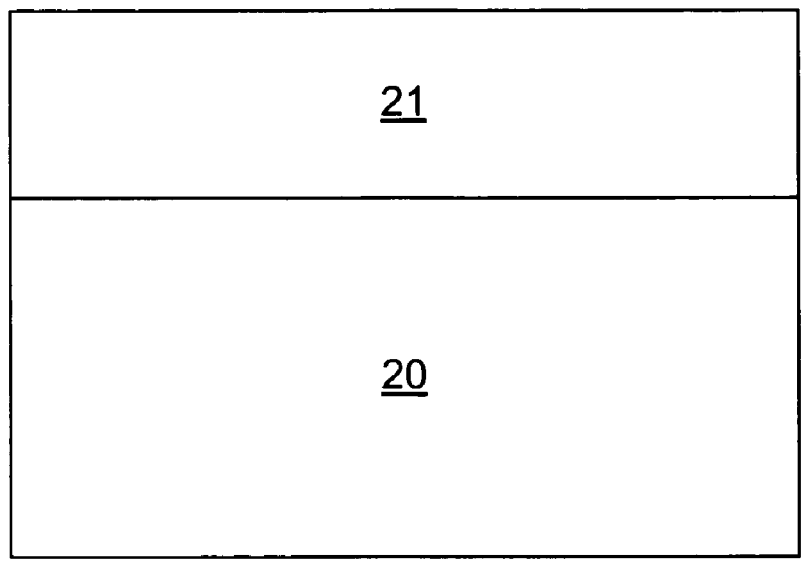
FIG. 1 is a schematic of a transparent conductive material on a substrate.

Referring to FIG. 1, a transparent conductive layer 21 can be deposited on a substrate 20. A transparent conductive layer can include a transparent conductive material. A transparent conductive material can include wide band-gap semiconductors which can be doped to relatively high levels and fabricated into thin films exhibiting both good light transmittance and electrical conductivity. For example, a transparent conductive material can be cadmium stannate. In one example, cadmium stannate can be derived from a cadmium stannate target having concentration of cadmium by percent weight can be greater than 67%, greater than 70%, less than 80%, less than 78%, less than 76%, between 67 and 75%, or between 70 and 75%.

A method of forming a transparent conductive layer can include depositing a film of metal, such as cadmium stannate, onto a transparent substrate. The metal film can be formed by sputtering, chemical vapor deposition, spin coating, spray coating, or dip coating, for example. In one example, a layer of substantially amorphous cadmium stannate can be deposited onto a suitable transparent substrate such as glass, or soda lime glass, by a suitable technique, such as sputtering. The sputter target can be made by forming a mixture of cadmium and tin in the ratio desired in the final cadmium stannate material. In another example, the metal film can be formed by dipping a substrate into a solution of a reaction product containing cadmium and tin derived from a cadmium compound and a tin compound. In yet another example, cadmium stannate can be deposited on the glass substrate by spray coating or by spin coating. Methods for depositing a film of cadmium stannate onto a transparent substrate are described in U.S. Pat. Nos. 6,221,495, 6,137,048, 5,922,142, 4,229,491, and 4,048,372, each of which is incorporated by reference in its entirety.

Figure 2:
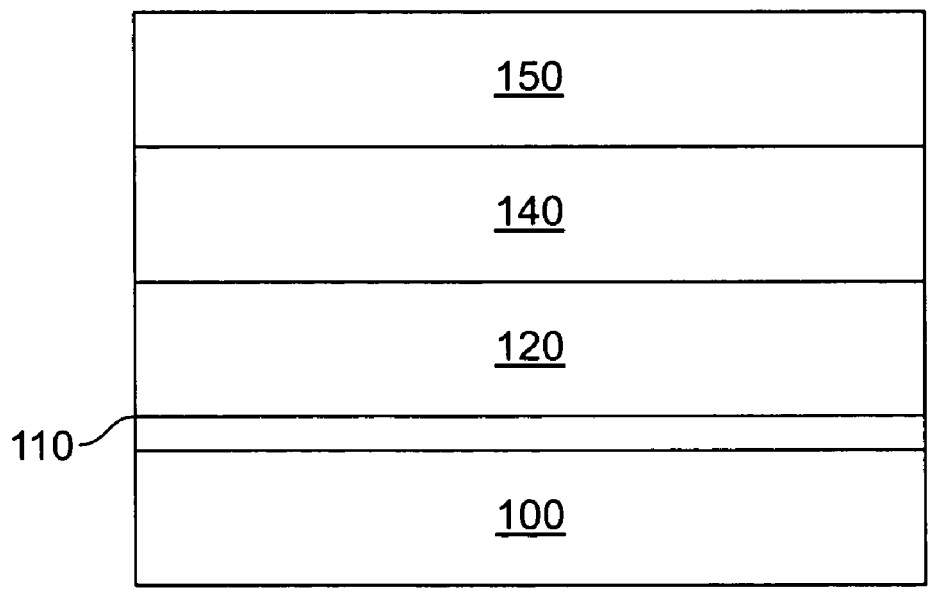
FIG. 2 is a schematic of a photovoltaic device having multiple layers.

Following the deposition of the cadmium stannate film, other semiconductor materials of differing conductivity types can be deposited on the cadmium stannate film to function as a semiconductor in a device. Referring to FIG. 2, a photovoltaic device 10 can include a transparent conductive layer 110 on a substrate 100, a first semiconductor layer 120, the first semiconductor layer positioned over the transparent conductive layer, and a second semiconductor layer 140, the second semiconductor layer positioned between a first semiconductor layer and a back metal contact 150. The transparent conductive layer can include metal such as cadmium or cadmium stannate, for example. Cadmium stannate can have the advantage of etching readily in both hydrofluoric and hydrochloric acid. The concentration of the metal in the transparent conductive layer can vary along a length of the transparent conductive layer. For example, the concentration of cadmium by percent weight can be greater than 67%, greater than 70%, less than 80%, less than 78%, less than 76%, between 67 and 75%, or between 70 and 75%.

Figure 3:
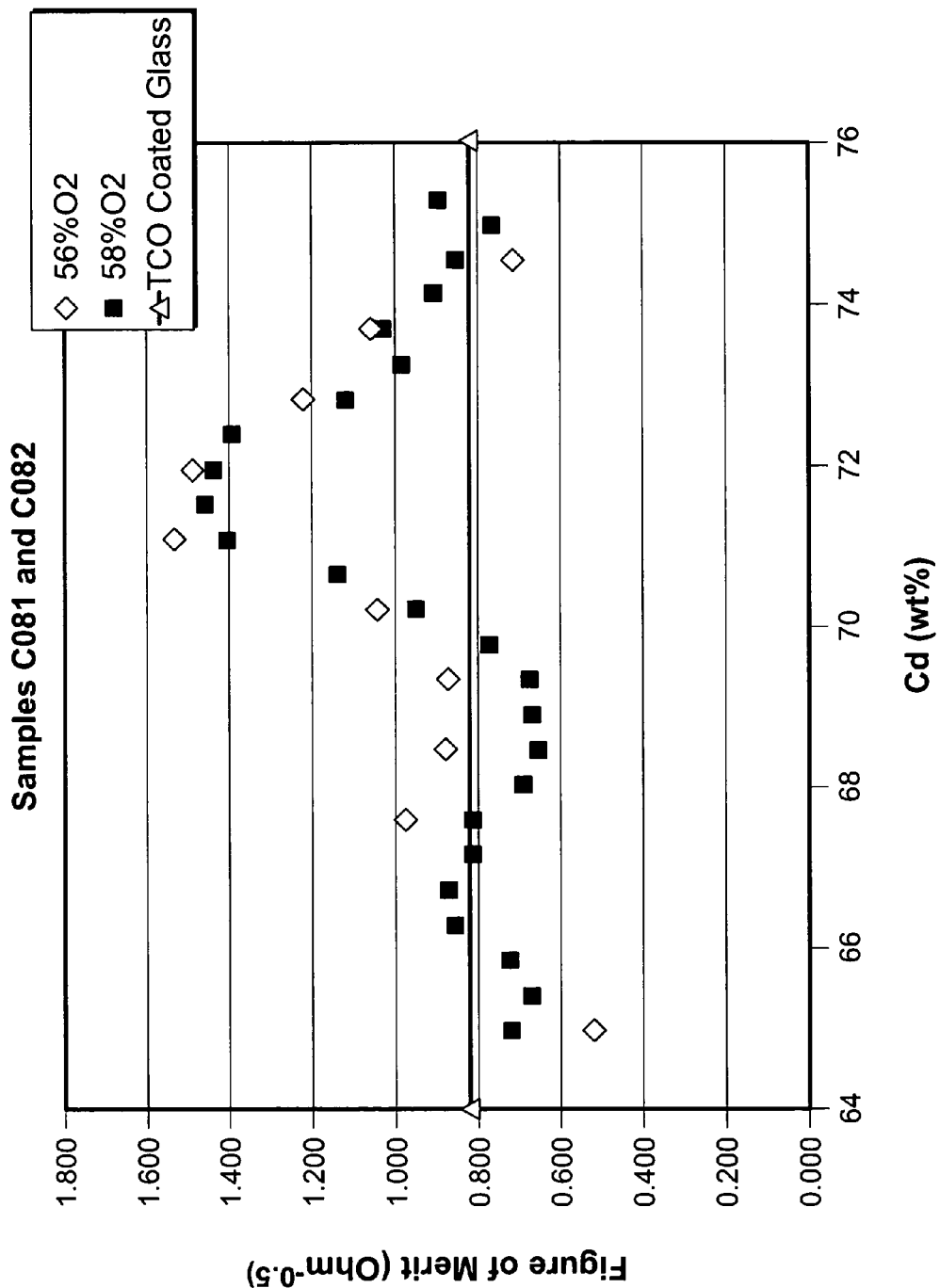
FIG. 3 is a chart showing a figure of merit as a function of percent metal in a transparent conductive material for a first set of experimental samples.

Referring to FIG. 3, a graph plotting a defined Figure of Merit against cadmium weight percentage is shown for a first set of experimental cadmium stannate TCO examples. The examples are represented by diagonal and square plotted points. The diagonal points represent examples having the corresponding cadmium wt. % reflected in FIG. 3 and formed by reactive sputtering in a 56% oxygen environment. The square points represent examples having the corresponding cadmium wt. % reflected in FIG. 3 and formed by reactive sputtering in a 58% oxygen environment. As shown in FIG. 3, examples of either one or both of the oxygen concentrations displayed higher Figures of Merit than the baseline, non-cadmium containing TCO coated glass (represented by the triangular points). For example, elevated Figure of Merit values were observed when the concentration of cadmium was greater than 67%, greater than 70%, less than 80%, less than 78%, less than 76%, between 67 and 75%, or between 70 and 75% or when the ratio of cadmium to tin by weight was varied to be greater than about 2.15:1, greater than about 2.2:1, greater than about 2.4:1, less than about 2.6:1, or less than about 3:1.

Figure 4:
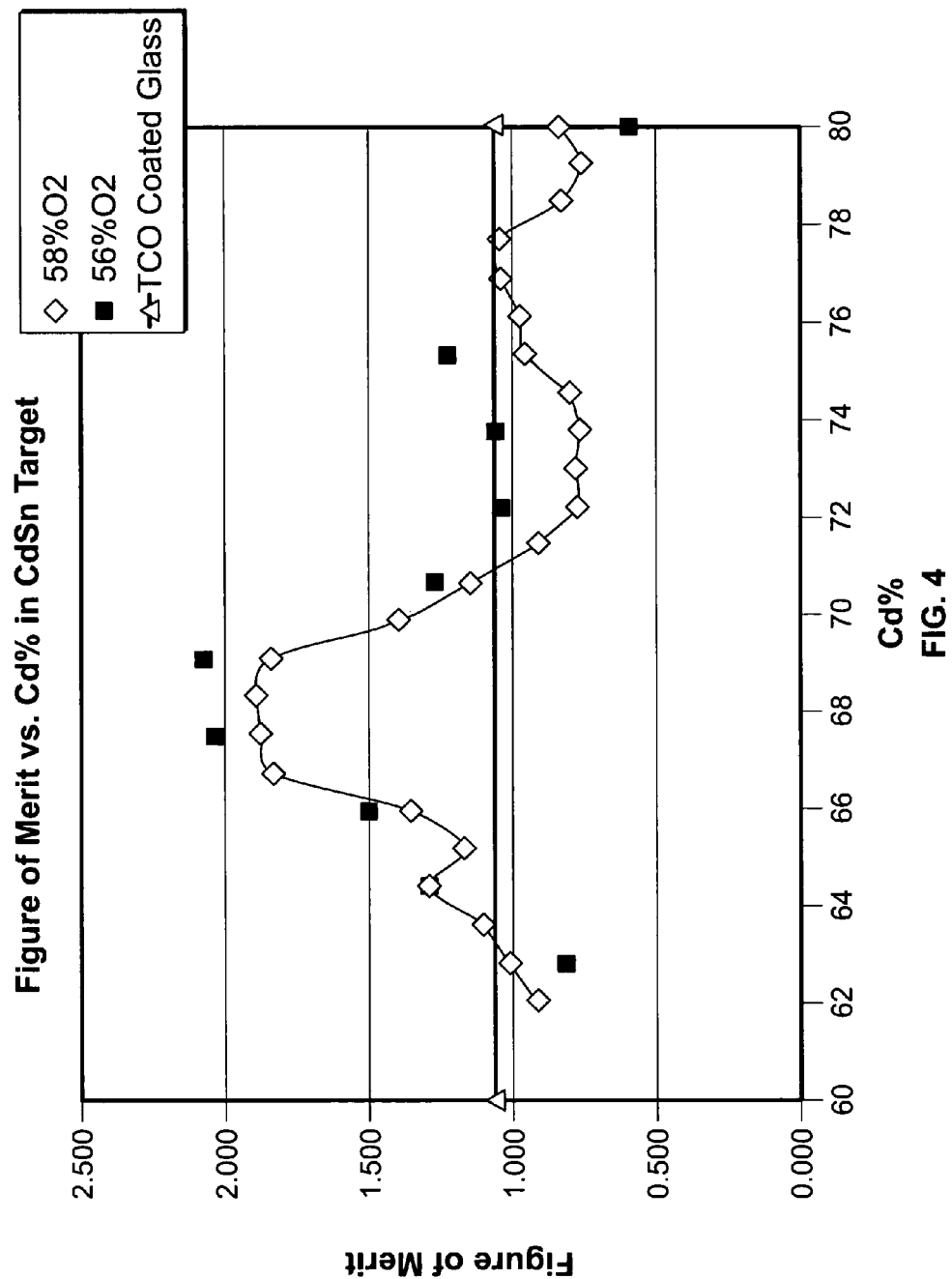
FIG. 4 is a chart showing a figure of merit as a function of percent metal in a transparent conductive material for a second set of experimental samples.

From the optical absorption data, a figure of merit was derived equal to 1/(the square root of (average absorption*sheet resistance)), wherein the average absorption is calculated over the wavelength interval of 350-850 nanometers. Therefore, a clear maximum in carrier concentration and minimum in film resistivity was apparent for examples having cadmium concentrations described above. The concentration of cadmium was measured using x-ray photoelectron spectroscopy taken from 1"×1" samples across a transparent conductive layer. Referring to FIG. 4, a second graph plotting a defined Figure of Merit against cadmium weight percentage is shown for a second set of experimental cadmium stannate TCO examples. The examples are represented by diagonal and square plotted points, as described above. As shown in FIG. 4, examples of either one or both of the oxygen concentrations displayed higher Figures of Merit than the baseline, non-cadmium containing TCO coated glass (represented by the triangular points). For example, unexpectedly elevated Figure of Merit values were observed when the concentration of cadmium was about 63 wt. % to about 71 wt. %, with a local maximum from about 67 wt. % to about 70 wt. %. This equates to a cadmium to tin ration of about 2.03:1 to about 2.33:1. The cadmium to tin ratio can be about 2.05:1 to about 2.30:1.

The figure of merit was derived equal to 1/(the square root of (average absorption* sheet resistance)), wherein the average absorption is calculated over the wavelength interval of 350-850 nanometers. Therefore, a clear maximum in carrier concentration and minimum in film resistivity was apparent for examples having cadmium concentrations described above.

Figure 5:
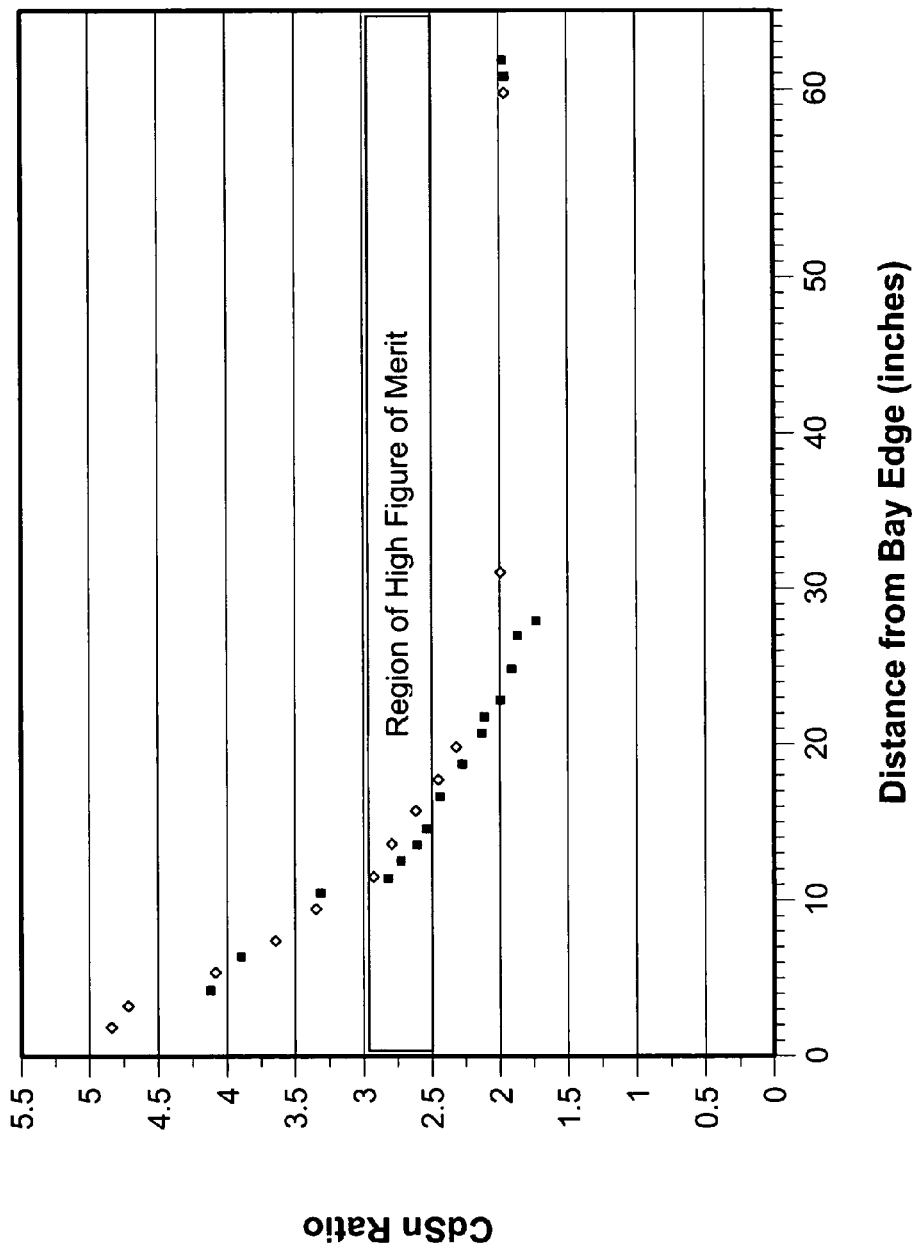
FIG. 5 is a chart showing an X-ray photoelectron spectroscopy (XPS) analysis of percent metal in a transparent conductive material.

Referring to FIG. 5, an x-ray photon spectroscopy analysis of a graded cadmium stannate target is shown.

By way of example, a first semiconductor layer can be a CdS layer and a second semiconductor layer can be a CdTe layer. However, any suitable combination of semiconductor materials of differing conductivity types can be used. The transparent conductive layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

The sputtering process is often used to deposit metal thin films such as a transparent conductive layer. When making a compound thin film with a metal oxide by sputtering, the percent weight of the compounds in the metal oxide in the target is directly proportional to the percent weight of the compound in the deposited film.

In one example, a cadmium stannate film can be created from sputtering a target and can contain stoichiometric amounts of metal oxides, such as tin oxide and cadmium oxide onto a substrate. The sputtering can be conducted in oxygen, which is substantially free of impurities which could react with the metal oxides present. During reactive sputtering, an optimum oxygen concentration can be from 56-58%, for example. The sputtering can be performed at room temperature. The sputtering process can include dislodging or ejecting material (e.g., atoms) from a metallic target, cadmium target, tin target, or target including both cadmium and tin. The target can be a tube or plate. As deposited by sputtering, transparent conductive layer is substantially amorphous. As is apparent to one skilled in the art, higher transmittance is obtained with a thinner film, and lower sheet resistivity is obtained with a thicker film. Applicants have found that varying the concentration of a metal oxide in the film has resulted in maximum carrier concentration and minimum film resistivity, and therefore, increased conductivity.

In one example, a sputtering target can include cadmium and tin in a weight ratio greater than 2.15:1, greater than 2.2:1, greater than 2.4:1, less than 2.6:1, or less than 3:1 distributed substantially uniformly throughout the target. A sputtering target can include cadmium and tin in a weight ration of about 2.03:1 to about 2.33:1. A sputtering target can include cadmium and tin in a weight ration of about 2.05:1 to about 2.30:1. A sputtering target can be cadmium and tin manufactured, formed, and/or shaped by any process and in any shape, composition, or configuration suitable for use with any appropriate sputtering tool, machine, apparatus, or system.

A sputtering target can be manufactured by ingot metallurgy. A sputtering target can be manufactured from cadmium, from tin, or from both cadmium and tin. The cadmium and tin can be present in the same target in stoichiometrically proper amounts. A sputtering target can be manufactured as a single piece in any suitable shape. A sputtering target can be a tube. A sputtering target can be manufactured by casting a metallic material into any suitable shape, such as a tube.

A sputtering target can be manufactured from more than one piece. A sputtering target can be manufactured from more than one piece of metal, for example, a piece of cadmium and a piece of tin. The cadmium and tin can be manufactured in any suitable shape, such as sleeves, and can be joined or connected in any suitable manner or configuration. For example, a piece of cadmium and a piece of tin can be welded together to form the sputtering target. One sleeve can be positioned within another sleeve.

A sputtering target can be manufactured by powder metallurgy. A sputtering target can be formed by consolidating metallic powder (e.g., cadmium or tin powder) to form the target. The metallic powder can be consolidated in any suitable process (e.g., pressing such as isostatic pressing) and in any suitable shape. The consolidating can occur at any suitable temperature. A sputtering target can be formed from metallic powder including more than one metal powder (e.g., cadmium and tin). More than one metallic powder can be present in stoichiometrically proper amounts.

A sputter target can be manufactured by positioning wire including target material adjacent to a base. For example wire including target material can be wrapped around a base tube. The wire can include multiple metals (e.g., cadmium and tin) present in stoichiometrically proper amounts. The base tube can be formed from a material that will not be sputtered. The wire can be pressed (e.g., by isostatic pressing).

A sputter target can be manufactured by spraying a target material onto a base. Metallic target material can be sprayed by any suitable spraying process, including thermal spraying and plasma spraying. The metallic target material can include multiple metals (e.g., cadmium and tin), present in stoichiometrically proper amounts. The base onto which the metallic target material is sprayed can be a tube.

A photovoltaic cell can have multiple layers. The multiple layers can include a bottom layer that can be a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine. Deposition of a semiconductor layer at high temperature directly on the transparent conductive oxide layer can result in reactions that negatively impact of the performance and stability of the photovoltaic device. Deposition of a capping layer of material with a high chemical stability (such as silicon dioxide, dialuminum trioxide, titanium dioxide, diboron trioxide and other similar entities) can significantly reduce the impact of these reactions on device performance and stability. The thickness of the capping layer should be minimized because of the high resistivity of the material used. Otherwise a resistive block counter to the desired current flow may occur. A capping layer can reduce the surface roughness of the transparent conductive oxide layer by filling in irregularities in the surface, which can aid in deposition of the window layer and can allow the window layer to have a thinner cross-section. The reduced surface roughness can help improve the uniformity of the window layer. Other advantages of including the capping layer in photovoltaic cells can include improving optical clarity, improving consistency in band gap, providing better field strength at the junction and providing better device efficiency as measured by open circuit voltage loss. Capping layers are described, for example, in U.S. Patent Publication 20050257824, which is incorporated by reference in its entirety.

The window layer and the absorbing layer can include, for example, a binary semiconductor such as group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. An example of a window layer and absorbing layer can be a layer of CdS coated by a layer of CdTe. A top layer can cover the semiconductor layers. The top layer can include a metal such as, for example, aluminum, molybdenum, nickel, titanium, tungsten, or alloys thereof.

Deposition of various layers in the manufacture of photovoltaic devices is described, for example, in U.S. Pat. Nos. 5,248,349, 5,372,646, 5,470,397, 5,536,333, 5,945,163, 6,037,241, and 6,444,043, each of which is incorporated by reference in its entirety. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. Conveyors are described in provisional U.S. application Ser. No. 11/692,667, which is incorporated by reference in its entirety.

The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The bottom layer of a photovoltaic cell can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, fluorine. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

A capping layer can be provided to supply this increase in resistance. The capping layer can be a very thin layer of a material with high chemical stability. The capping layer can have higher transparency than a comparable thickness of semiconductor material having the same thickness. Examples of materials that are suitable for use as a capping layer include silicon dioxide, dialuminum trioxide, titanium dioxide, diboron trioxide and other similar entities. Capping layer can also serve to isolate the transparent conductive layer electrically and chemically from the first semiconductor layer preventing reactions that occur at high temperature that can negatively impact performance and stability. The capping layer can also provide a conductive surface that can be more suitable for accepting deposition of the first semiconductor layer. For example, the capping layer can provide a surface with decreased surface roughness.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

The first semiconductor layer can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. It can be a binary semiconductor, for example it can be CdS. The second semiconductor layer can be deposited onto the first semiconductor layer. The second semiconductor can serve as an absorber layer for the incident light when the first semiconductor layer is serving as a window layer. Similar to the first semiconductor layer, the second semiconductor layer can also be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof.

A number of embodiments have been described. Nevertheless, it will be understood that various modifications may be made without departing from the spirit and scope of the invention. For example, the semiconductor layers can include a variety of other materials, as can the materials used for the buffer layer and the capping layer. In addition, the device may contain interfacial layers between a second semiconductor layer and a back metal electrode to reduce resistive losses and recombination losses at the interface between the second semiconductor and the back metal electrode. Accordingly, other embodiments are within the scope of the following claims.

What is claimed is:

1. A photovoltaic device comprising:
a transparent conductive layer on a substrate, the transparent conductive layer comprising cadmium stannate, wherein cadmium has a concentration of about 67 percent to about 75 percent by weight and wherein the cadmium to tin ratio is greater than about 2.03:1 and less than about 3:1; and
a semiconductor layer adjacent to the transparent conductive layer, the semiconductor layer comprising cadmium.

2. The device of claim 1, wherein the transparent conductive oxide has a figure of merit, 1/(the square root of (average absorption*sheet resistance)), of greater than 0.9, wherein the average absorption is the absorption averaged over a wavelength interval of 350-850 nanometers.

3. The device of claim 1, wherein the cadmium to tin ratio is about 2.03:1 to about 2.3:1.

* * * * *